United States Patent
Bai et al.

(10) Patent No.: US 10,361,256 B2
(45) Date of Patent: Jul. 23, 2019

(54) OLED BACK PLATE

(71) Applicant: Shenzhen China Star Optoelectronics Technology Co., Ltd., Shenzhen (CN)

(72) Inventors: Dan Bai, Shenzhen (CN); Yuanjun Hsu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 93 days.

(21) Appl. No.: 15/508,097

(22) PCT Filed: Feb. 15, 2017

(86) PCT No.: PCT/CN2017/073596
§ 371 (c)(1),
(2) Date: Mar. 1, 2017

(87) PCT Pub. No.: WO2018/120365
PCT Pub. Date: Jul. 5, 2018

(65) Prior Publication Data
US 2018/0226458 A1    Aug. 9, 2018

(30) Foreign Application Priority Data

Dec. 29, 2016   (CN) .......................... 2016 1 1243671

(51) Int. Cl.
*H01L 27/32*    (2006.01)
*H01L 51/52*    (2006.01)
*H01L 51/56*    (2006.01)

(52) U.S. Cl.
CPC ...... *H01L 27/3246* (2013.01); *H01L 27/3258* (2013.01); *H01L 27/3262* (2013.01);
(Continued)

(58) Field of Classification Search
CPC . H01L 27/32; H01L 27/3246; H01L 27/3258; H01L 27/3276; H01L 51/5206
See application file for complete search history.

(56) References Cited

U.S. PATENT DOCUMENTS

| | | | |
|---|---|---|---|
| 6,140,162 A * | 10/2000 | Yeo | H01L 27/1214 438/155 |
| 2005/0272189 A1* | 12/2005 | Cho | H01L 27/1214 438/163 |

(Continued)

FOREIGN PATENT DOCUMENTS

| | | |
|---|---|---|
| CN | 101577283 A | 11/2009 |
| CN | 104143533 A | 11/2014 |

*Primary Examiner* — Phuc T Dang
(74) *Attorney, Agent, or Firm* — Leong C. Lei

(57) ABSTRACT

The present invention provides an OLED back plate and a manufacture method thereof. In the manufacture method of the OLED back plate of the present invention, by forming the planarization layer on the interlayer dielectric layer, and the planarization layer can serve as the mask of the etching process of the interlayer dielectric layer, and also can make the surface of the second source made on the surface thereof be flattened, which is advantageous to increase the area of the OLED light emitting area and to increase the aperture ratio. In the OLED back plate of the present invention, by forming the planarization layer on the interlayer dielectric layer, the surface of the second source made on the surface of the planarization layer is flattened, of which the OLED light emitting area is larger and the aperture ratio is higher.

8 Claims, 12 Drawing Sheets

(52) U.S. Cl.
CPC ...... *H01L 27/3276* (2013.01); *H01L 51/5206* (2013.01); *H01L 51/56* (2013.01); *H01L 2227/323* (2013.01)

(56) References Cited

U.S. PATENT DOCUMENTS

| | | | |
|---|---|---|---|
| 2016/0276620 A1* | 9/2016 | Hong | H01L 51/5243 |
| 2016/0300894 A1* | 10/2016 | Park | H01L 27/3246 |
| 2017/0077199 A1* | 3/2017 | Nguyen | H01L 27/3258 |
| 2017/0154934 A1* | 6/2017 | Kim | H01L 51/525 |
| 2017/0179209 A1* | 6/2017 | Kim | H01L 27/3246 |

\* cited by examiner providing a substrate, and forming a buffer layer, a semiconductor layer, a gate insulation layer, a gate material layer and an interlayer dielectric layer on the substrate from bottom to top; the semiconductor layer comprising a first semiconductor pattern, a second semiconductor pattern and a first storage electrode, which are spaced; the gate material layer comprising a first gate, a second gate and a second storage electrode, which are spaced; two ends of the first semiconductor pattern being respectively arranged with a first source contact area and a first drain contact area, and two ends of the second semiconductor pattern being respectively arranged with a second source contact area and a second drain contact area ⎯ 1

↓ forming a planarization layer on the interlayer dielectric layer, and forming a first contact hole, a first drain contact hole, and a second contact hole and a second drain contact hole on the planarization layer and the interlayer dielectric layer ⎯ 2

↓ forming a source-drain material layer on the planarization layer, and the source-drain material layer comprising a first source, a first drain, a second source and a second drain, which are spaced, and the first source, the first drain, the second source and the second drain contacting with the first source contact area, the first drain contact area, the second source contact area and the second drain contact area respectively through the first contact hole, the first drain contact hole, the second contact hole and the second drain contact hole ⎯ 3

↓ forming a pixel definition layer on the source-drain material layer and the planarization layer, and forming a support layer on the pixel definition layer; the pixel definition layer being arranged with an opening correspondingly above the second source, and the opening defining an OLED light emitting area on the second source; the second source serving as an anode of the OLED at the same time ⎯ 4

Fig. 2

OLED BACK PLATE

FIELD OF THE INVENTION

The present invention relates to a display technology field, and more particularly to an OLED back plate and a manufacture method thereof.

BACKGROUND OF THE INVENTION

The Organic Light Emitting Display (OLED) device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED display element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, the Indium Tin Oxide (ITO) electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The AMOLED display device generally comprises an OLED back plate and an organic material layer located on the OLED back plate. FIG. 1 is a structure diagram of an OLED back plate according to prior art. As shown in FIG. 1, the OLED back plate comprises a substrate 100, a buffer layer 200, a semiconductor layer 300, a gate insulation layer 400, a gate material layer 500, an interlayer dielectric layer 600, a source-drain material layer 800, a pixel definition layer 910 and a support layer 920, which are stacked up from bottom to top, wherein the source-drain material layer 800 comprises a first source 810 and a first drain 820 applied in a switch TFT T100, and a second source 830 and a second drain 840 applied in a drive TFT T200, and the second source 830 serves as an anode of the OLED at the same time, and the pixel definition layer 910 being arranged with an opening 915 correspondingly above the second source 830, and the opening 915 defining an OLED light emitting area on the second source 830, and the OLED light emitting area is employed to form an OLED light emitting layer.

In the aforesaid OLED back plate, the second source 830 is directly formed on the interlayer dielectric layer 600 with a poor surface flatness, and therefore, the surface flatness of the second source 830 is worse. However, the OLED light emitting area usually selects the area with a high surface flatness, and only a relatively flat portion of the surface of the second source electrode 830 can be selected to form the OLED light emitting area. Accordingly, the area of the obtained OLED light emitting area is smaller and the aperture ratio is lower.

SUMMARY OF THE INVENTION

An objective of the present invention is to provide a manufacture method of an OLED back plate, which is advantageous to increase the area of the OLED light emitting area and to increase the aperture ratio.

Another objective of the present invention is to provide an OLED back plate, of which the OLED light emitting area is larger and the aperture ratio is higher.

For realizing the aforesaid objectives, the present invention provides a manufacture method of an OLED back plate, comprising steps of:

step 1, providing a substrate, and forming a buffer layer, a semiconductor layer, a gate insulation layer, a gate material layer and an interlayer dielectric layer on the substrate from bottom to top;

the semiconductor layer comprising a first semiconductor pattern, a second semiconductor pattern and a first storage electrode, which are spaced;

the gate material layer comprising a first gate, a second gate and a second storage electrode, which are spaced, and the first gate, the second gate and the second storage electrode being correspondingly arranged above the first semiconductor pattern, the second semiconductor pattern and the first storage electrode, respectively; the first storage electrode and the second storage electrode constituting a storage capacitor;

two ends of the first semiconductor pattern being respectively arranged with a first source contact area and a first drain contact area, and two ends of the second semiconductor pattern being respectively arranged with a second source contact area and a second drain contact area;

step 2, forming a planarization layer on the interlayer dielectric layer, and forming a first contact hole and a first drain contact hole correspondingly above the first source contact area and the first drain contact area, respectively, and a second contact hole and a second drain contact hole correspondingly above the second source contact area and the second drain contact area, respectively on the planarization layer and the interlayer dielectric layer;

step 3, forming a source-drain material layer on the planarization layer, and patterning the source-drain material layer to obtain a first source, a first drain, a second source and a second drain, which are spaced, and the first source, the first drain, the second source and the second drain contacting with the first source contact area, the first drain contact area, the second source contact area and the second drain contact area respectively through the first contact hole, the first drain contact hole, the second contact hole and the second drain contact hole;

the first source, the first drain, the first semiconductor pattern and the first gate constituting a switch TFT; the second source, the second drain, the second semiconductor pattern and the second gate constituting a drive TFT;

step 4, forming a pixel definition layer on the source-drain material layer and the planarization layer, and forming a support layer on the pixel definition layer;

the pixel definition layer being arranged with an opening correspondingly above the second source, and the opening defining an OLED light emitting area on the second source; the second source serving as an anode of the OLED at the same time.

The step 1 comprises:

step 11, providing a substrate and depositing a buffer layer on the substrate;

step 12, depositing an amorphous silicon layer on the buffer layer, and employing a crystallization process to convert the amorphous silicon layer into the polysilicon layer, and patterning the polysilicon layer to obtain a semiconductor layer, and the semiconductor layer comprising the first semiconductor pattern, the second semiconductor pattern and the first storage electrode, which are spaced;

step 13, deposing a gate insulation layer on the semiconductor layer;

step 14, forming a patterned photoresist layer on the gate insulation layer, and the patterned photoresist layer exposing the gate insulation layer corresponding to two ends of the first semiconductor pattern, two ends of the second semiconductor pattern and an area of the entire first storage electrode;

employing the patterned photoresist layer as a mask to implement ion injection to the two ends of the first semiconductor pattern, the two ends of the second semiconductor pattern and the entire first storage electrode to achieve P type ion heavy doping, and thus to form the first source contact area and the first drain contact area at the two ends of the first semiconductor pattern, and to form the second source contact area and the second drain contact area at the two ends of the second semiconductor pattern, and all of the first source contact area, the first drain contact area, the second source contact area, the second drain contact area and the entire first storage electrode are ion heavily doped areas;

step 15, stripping the patterned photoresist layer; depositing the gate material layer on the gate insulation layer, and patterning the gate material layer to obtain the first gate, the second gate and the second storage electrode, which are spaced;

step 16, depositing the interlayer dielectric layer on the gate material layer and the gate insulation layer.

In step 14, implementing P type ion injection to the two ends of the first semiconductor pattern, the two ends of the second semiconductor pattern and the entire first storage electrode to achieve P type ion heavy doping;

all of the first source contact area, the first drain contact area, the second source contact area, the second drain contact area and the entire first storage electrode are P type ion heavily doped areas, and the P type ion is boron ion.

The step 2 comprises:

step 21, coating an organic photoresist on the interlayer dielectric layer to form the planarization layer, and patterning the planarization layer to form a first through hole and a second through hole correspondingly above the first source contact area and the first drain contact area, respectively, and a third through hole and a fourth through hole correspondingly above the second source contact area and the second drain contact area, respectively on the planarization layer;

step 22, employing the patterned planarization layer as a mask to etch the interlayer dielectric layer to form a fifth through hole, a sixth through hole, a seventh through hole and an eighth through hole correspondingly below the first through hole, the second through hole, the third through hole and the fourth through hole on the interlayer dielectric layer;

the first through hole and the fifth through hole constituting the first source contact hole, and the second through hole and the sixth through hole constituting the first drain contact hole, and the third through hole and the seventh through hole constituting the second source contact hole, and the fourth through hole and the eighth through hole constituting the second drain contact hole.

The step 4 comprises:

step 41, coating an organic photoresist on the source-drain material layer and the planarization layer to form an organic photoresist layer;

step 42, employing a halftone mask to implement exposure and development to the organic photoresist layer, and meanwhile obtaining the pixel definition layer and the support layer.

The present invention further provides an OLED back plate, comprising: a substrate, a buffer layer, a semiconductor layer, a gate insulation layer, a gate material layer, an interlayer dielectric layer, a planarization layer, a source-drain material layer, a pixel definition layer and a support layer, which are stacked up from bottom to top;

the semiconductor layer comprising a first semiconductor pattern, a second semiconductor pattern and a first storage electrode, which are spaced; the gate material layer comprising a first gate, a second gate and a second storage electrode, which are spaced, and the first gate, the second gate and the second storage electrode being correspondingly arranged above the first semiconductor pattern, the second semiconductor pattern and the first storage electrode, respectively;

the source-drain material layer comprising a first source, a first drain, a second source and a second drain;

two ends of the first semiconductor pattern being respectively arranged with a first source contact area and a first drain contact area, and two ends of the second semiconductor pattern being respectively arranged with a second source contact area and a second drain contact area;

a first contact hole and a first drain contact hole correspondingly above the first source contact area and the first drain contact area, respectively, and a second contact hole and a second drain contact hole correspondingly above the second source contact area and the second drain contact area, respectively being arranged on the planarization layer and the interlayer dielectric layer;

the first source, the first drain, the second source and the second drain contacting with the first source contact area, the first drain contact area, the second source contact area and the second drain contact area respectively through the first contact hole, the first drain contact hole, the second contact hole and the second drain contact hole;

the first source, the first drain, the first semiconductor pattern and the first gate constituting a switch TFT; the second source, the second drain, the second semiconductor pattern and the second gate constituting a drive TFT; the first storage electrode and the second storage electrode constituting a storage capacitor;

the pixel definition layer being arranged with an opening correspondingly above the second source, and the opening defining an OLED light emitting area on the second source; the second source serving as an anode of the OLED at the same time.

Both materials of the first semiconductor pattern, the second semiconductor pattern and the first storage electrode are polysilicon, and all of the first source contact area, the first drain contact area, the second source contact area, the second drain contact area and the entire first storage electrode are ion heavily doped areas.

all of the first source contact area, the first drain contact area, the second source contact area, the second drain contact area and the entire first storage electrode are P type ion heavily doped areas, and the P type ion is boron ion.

A first through hole and a second through hole correspondingly above the first source contact area and the first drain contact area, respectively, and a third through hole and a fourth through hole correspondingly above the second source contact area and the second drain contact area, respectively are arranged on the planarization layer;

a fifth through hole, a sixth through hole, a seventh through hole and an eighth through hole correspondingly below the first through hole, the second through hole, the third through hole and the fourth through hole are arranged on the interlayer dielectric layer;

the first through hole and the fifth through hole constituting the first source contact hole, and the second through hole and the sixth through hole constituting the first drain contact hole, and the third through hole and the seventh through hole constituting the second source contact hole, and the fourth through hole and the eighth through hole constituting the second drain contact hole.

Both materials of the pixel definition layer and the support layer are organic photoresist, and the two have the same materials, and are structurally integrated.

The present invention further provides an OLED back plate, comprising: a substrate, a buffer layer, a semiconductor layer, a gate insulation layer, a gate material layer, an interlayer dielectric layer, a planarization layer, a source-drain material layer, a pixel definition layer and a support layer, which are stacked up from bottom to top;

the semiconductor layer comprising a first semiconductor pattern, a second semiconductor pattern and a first storage electrode, which are spaced; the gate material layer comprising a first gate, a second gate and a second storage electrode, which are spaced, and the first gate, the second gate and the second storage electrode being correspondingly arranged above the first semiconductor pattern, the second semiconductor pattern and the first storage electrode, respectively;

the source-drain material layer comprising a first source, a first drain, a second source and a second drain;

two ends of the first semiconductor pattern being respectively arranged with a first source contact area and a first drain contact area, and two ends of the second semiconductor pattern being respectively arranged with a second source contact area and a second drain contact area;

a first contact hole and a first drain contact hole correspondingly above the first source contact area and the first drain contact area, respectively, and a second contact hole and a second drain contact hole correspondingly above the second source contact area and the second drain contact area, respectively being arranged on the planarization layer and the interlayer dielectric layer;

the first source, the first drain, the second source and the second drain contacting with the first source contact area, the first drain contact area, the second source contact area and the second drain contact area respectively through the first contact hole, the first drain contact hole, the second contact hole and the second drain contact hole;

the first source, the first drain, the first semiconductor pattern and the first gate constituting a switch TFT; the second source, the second drain, the second semiconductor pattern and the second gate constituting a drive TFT; the first storage electrode and the second storage electrode constituting a storage capacitor;

the pixel definition layer being arranged with an opening correspondingly above the second source, and the opening defining an OLED light emitting area on the second source; the second source serving as an anode of the OLED at the same time;

wherein both materials of the first semiconductor pattern, the second semiconductor pattern and the first storage electrode are polysilicon, and all of the first source contact area, the first drain contact area, the second source contact area, the second drain contact area and the entire first storage electrode are ion heavily doped areas;

wherein both materials of the pixel definition layer and the support layer are organic photoresist, and the two have the same materials, and are structurally integrated.

The benefits of the present invention are: the present invention provides a manufacture method of an OLED back plate, and by forming the planarization layer on the interlayer dielectric layer, and the planarization layer can serve as the mask of the etching process of the interlayer dielectric layer, and also can make the surface of the second source made on the surface thereof be flattened, which is advantageous to increase the area of the OLED light emitting area and to increase the aperture ratio. The present invention provides an OLED back plate, and by forming the planarization layer on the interlayer dielectric layer, the surface of the second source made on the surface of the planarization layer is flattened, of which the OLED light emitting area is larger and the aperture ratio is higher.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings,

FIG. 2 is a flowchart of a manufacture method of an OLED back plate according to the present invention;

DETAILED DESCRIPTION OF PREFERRED EMBODIMENTS

Figure 1:
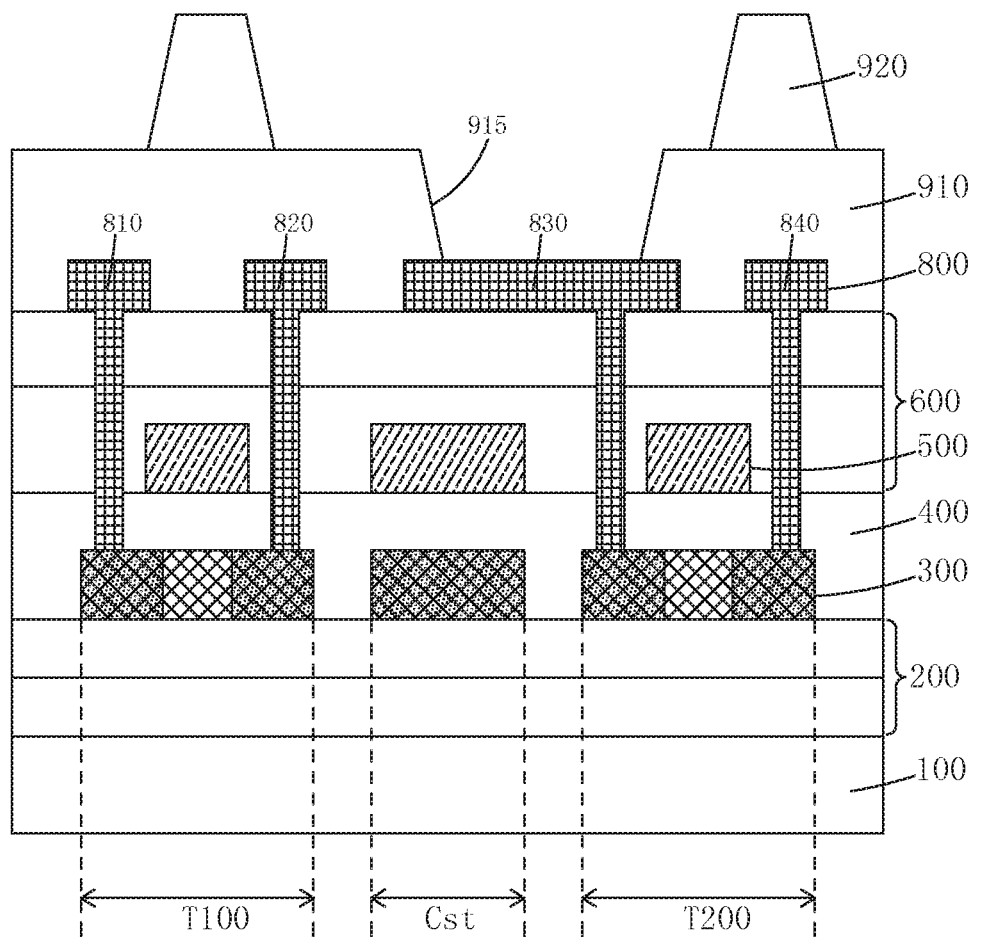
FIG. 1 is a structure diagram of an OLED back plate according to prior art.

For better explaining the technical solution and the effect of the present invention, the present invention will be further described in detail with the accompanying drawings and the specific embodiments.

Please refer to FIG. 2. The present invention provides a manufacture method of an OLED back plate, comprising steps of:

step 1, as shown in FIG. 3 to FIG. 10, providing a substrate 10, and forming a buffer layer 20, a semiconductor layer 30, a gate insulation layer 40, a gate material layer 50 and an interlayer dielectric layer 60 on the substrate 10 from bottom to top;

the semiconductor layer 30 comprising a first semiconductor pattern 31, a second semiconductor pattern 32 and a first storage electrode 33, which are spaced;

the gate material layer 50 comprising a first gate 51, a second gate 52 and a second storage electrode 53, which are spaced, and the first gate 51, the second gate 52 and the second storage electrode 53 being correspondingly arranged above the first semiconductor pattern 31, the second semiconductor pattern 32 and the first storage electrode 33, respectively; the first storage electrode 33 and the second storage electrode 53 constituting a storage capacitor Cst;

two ends of the first semiconductor pattern 31 being respectively arranged with a first source contact area 311 and a first drain contact area 312, and two ends of the second semiconductor pattern 32 being respectively arranged with a second source contact area 321 and a second drain contact area 322.

Specifically, the first storage electrode 33 is arranged between the first semiconductor pattern 31 and the second semiconductor pattern 32, and the second storage electrode 53 is arranged between the first gate 51 and the second gate 52.

Figure 3:
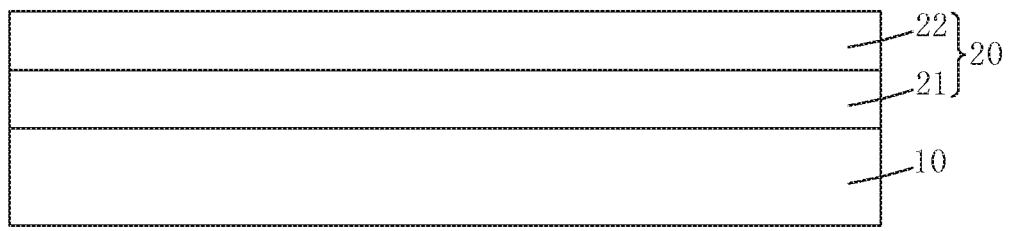
FIG. 3 to FIG. 10 are diagrams of step 1 of the manufacture method of the OLED back plate according to the present invention.

Specifically, the step 1 comprises steps of:

step 11, as shown in FIG. 3, providing a substrate 10 and depositing a buffer layer 20 on the substrate 10.

Specifically, the substrate 10 is a glass substrate.

Figure 4:
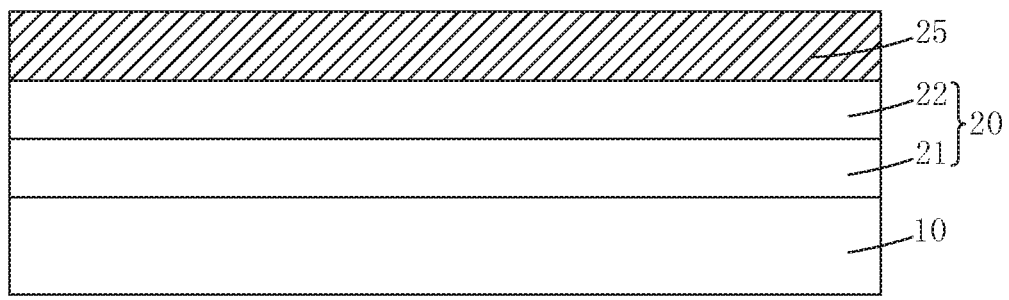
Figure 5:
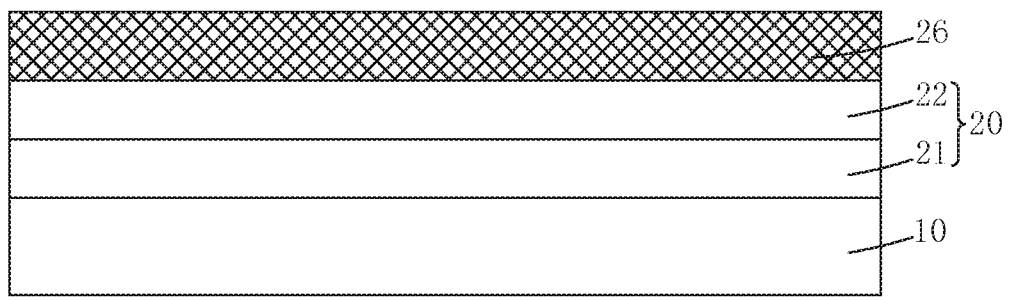
Figure 6:
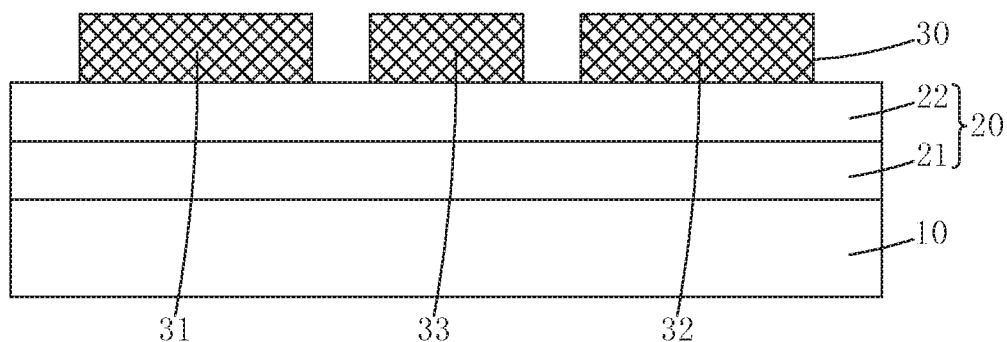
Figure 7:
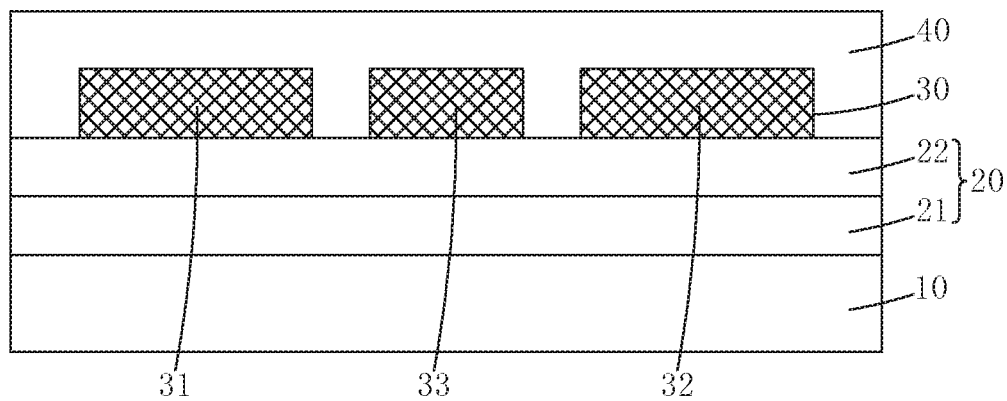

Specifically, the buffer layer 20 comprises a first silicon nitride ($SiN_x$) layer 21 located on the substrate 10 and a first silicon oxide ($SiO_x$) layer 22 located on the first silicon nitride layer 21.

step 12, as shown in FIG. 4 to FIG. 6, depositing an amorphous silicon layer 25 on the buffer layer 20, and employing a crystallization process to convert the amorphous silicon layer 25 into the polysilicon layer 26, and patterning the polysilicon layer 26 to obtain a semiconductor layer 30, and the semiconductor layer 30 comprising the first semiconductor pattern 31, the second semiconductor pattern 32 and the first storage electrode 33, which are spaced.

step 13, as shown in FIG. 7, deposing a gate insulation layer 40 on the semiconductor layer 30.

Figure 8:
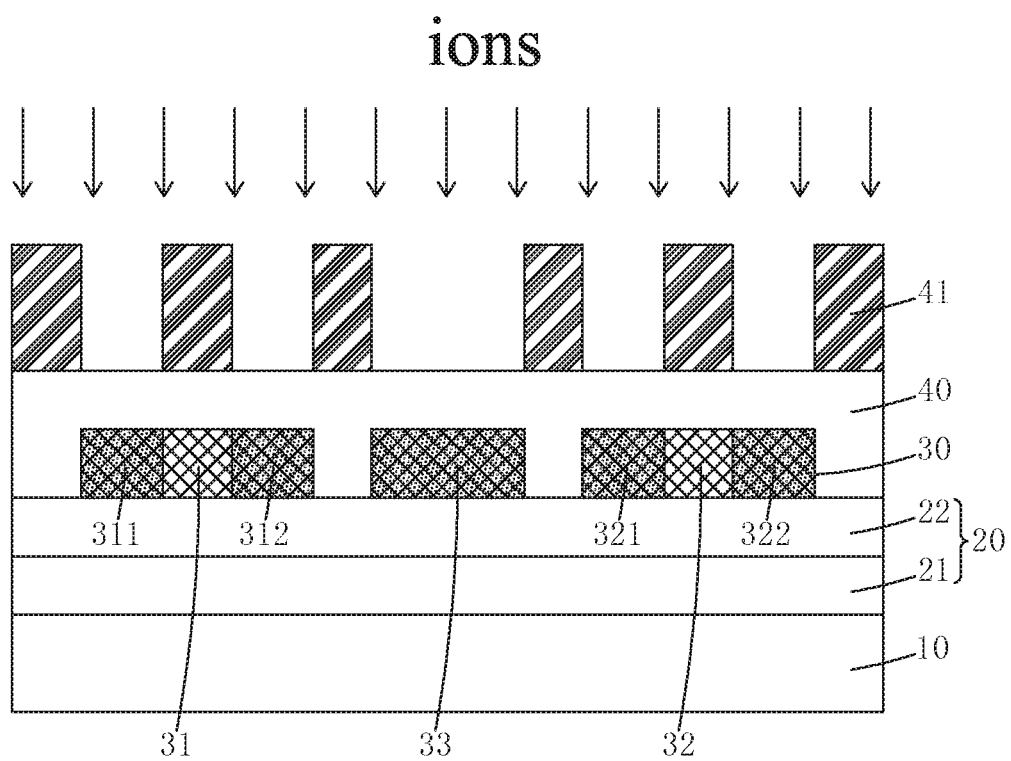

Specifically, a material of the gate insulation layer 40 comprises at least one of silicon oxide and silicon nitride.

step 14, as shown in FIG. 8, forming a patterned photoresist layer 41 on the gate insulation layer 40, and the patterned photoresist layer 41 exposing the gate insulation layer 40 corresponding to two ends of the first semiconductor pattern 31, two ends of the second semiconductor pattern 32 and an area of the entire first storage electrode 33;

employing the patterned photoresist layer 41 as a mask to implement ion injection to the two ends of the first semiconductor pattern 31, the two ends of the second semiconductor pattern 32 and the entire first storage electrode 33 to achieve P type ion heavy doping, and thus to form the first source contact area 311 and the first drain contact area 312 at the two ends of the first semiconductor pattern 31, and to form the second source contact area 321 and the second drain contact area 322 at the two ends of the second semiconductor pattern 32, and all of the first source contact area 311, the first drain contact area 312, the second source contact area 321, the second drain contact area 322 and the entire first storage electrode 33 are ion heavily doped areas.

Specifically, an ion concentration range in the ion heavily doped areas is $10^{19}$-$10^{21}$ ions/cm³.

Figure 9:
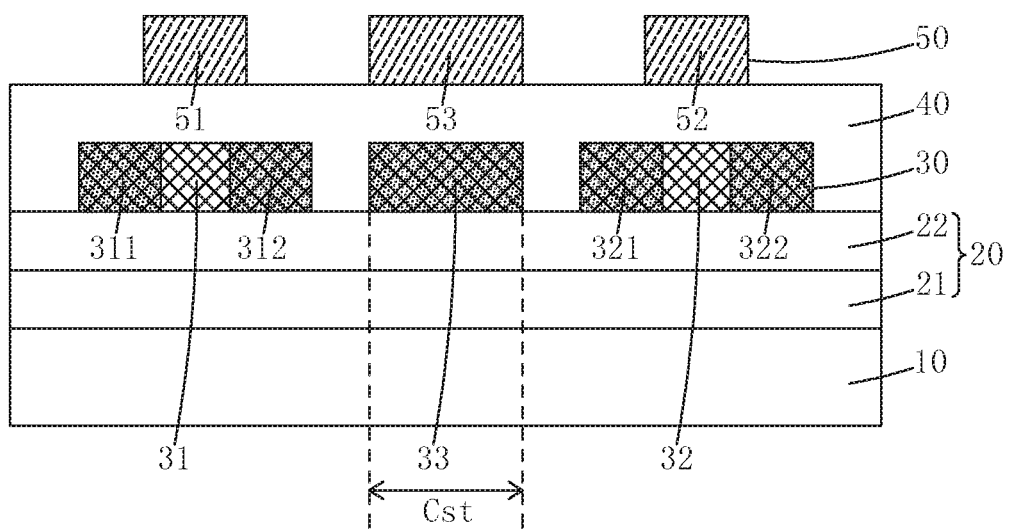

Specifically, in step 14, implementing P type ion injection to the two ends of the first semiconductor pattern 31, the two ends of the second semiconductor pattern 32 and the entire first storage electrode 33 to achieve P type ion heavy doping;

all of the first source contact area 311, the first drain contact area 312, the second source contact area 321, the second drain contact area 322 and the entire first storage electrode 33 are P type ion heavily doped areas, and the P type ion is boron ion.

step 15, as shown in FIG. 9, stripping the patterned photoresist layer 41; depositing the gate material layer 50 on the gate insulation layer 40, and patterning the gate material layer 50 to obtain the first gate 51, the second gate 52 and the second storage electrode 53, which are spaced.

Figure 10:
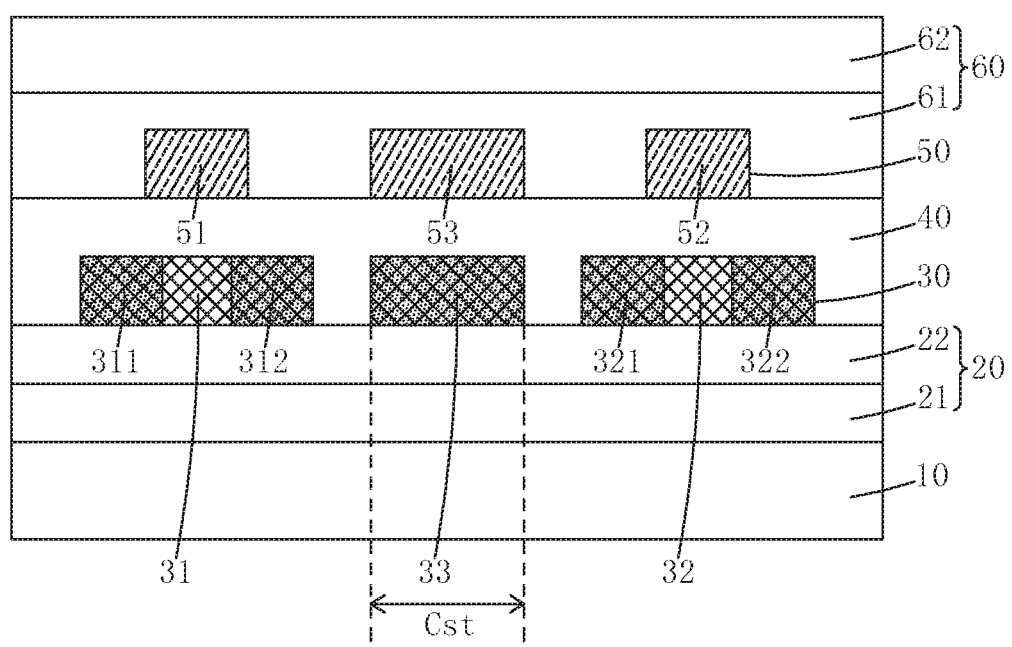

Specifically, materials of the first gate 51, the second gate 52 and the second storage electrode 53 are molybdenum (Mo).

step 16, as shown in FIG. 10, depositing the interlayer dielectric layer 60 on the gate material layer 50 and the gate insulation layer 40.

Figure 11:
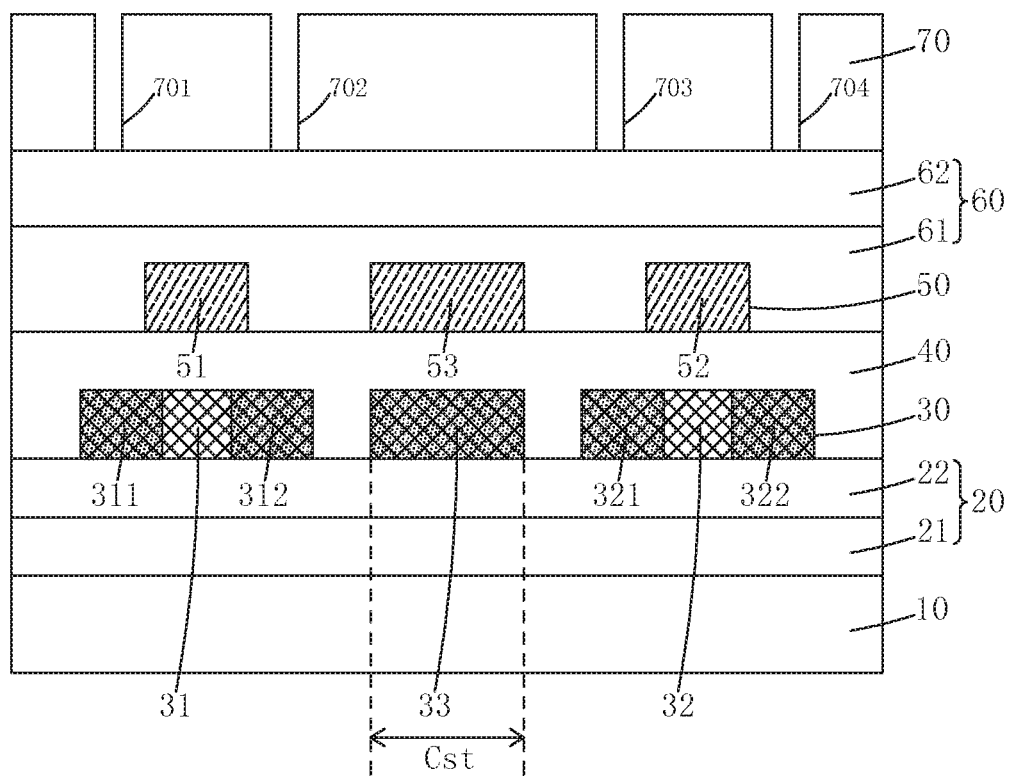
FIG. 11 to FIG. 12 are diagrams of step 2 of the manufacture method of the OLED back plate according to the present invention.
Figure 12:
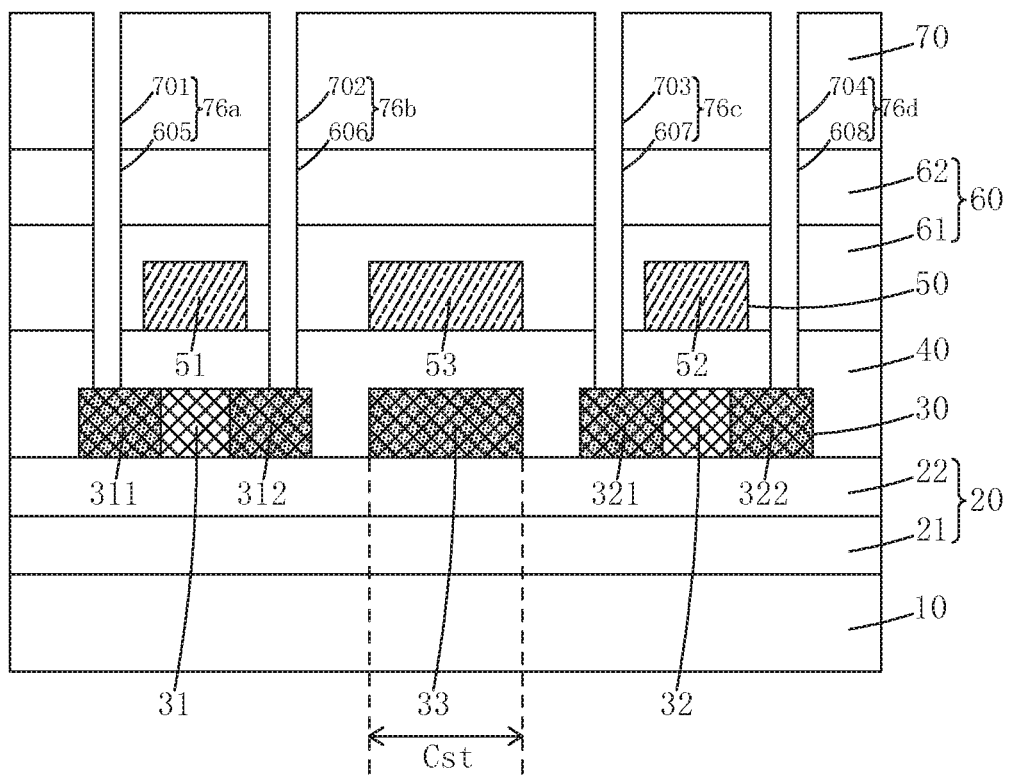

Specifically, the interlayer 60 comprises a second silicon oxide layer 61 on the gate material layer 50 and the gate insulation layer 40 and a second silicon nitride layer 62 on the second silicon oxide layer 61.

step 2, as shown in FIG. 11 to FIG. 12, forming a planarization layer 70 on the interlayer dielectric layer 60, and forming a first contact hole 76a and a first drain contact hole 76b correspondingly above the first source contact area 311 and the first drain contact area 312, respectively, and a second contact hole 76c and a second drain contact hole 76b correspondingly above the second source contact area 321 and the second drain contact area 322, respectively on the planarization layer 70 and the interlayer dielectric layer 60.

Figure 13:
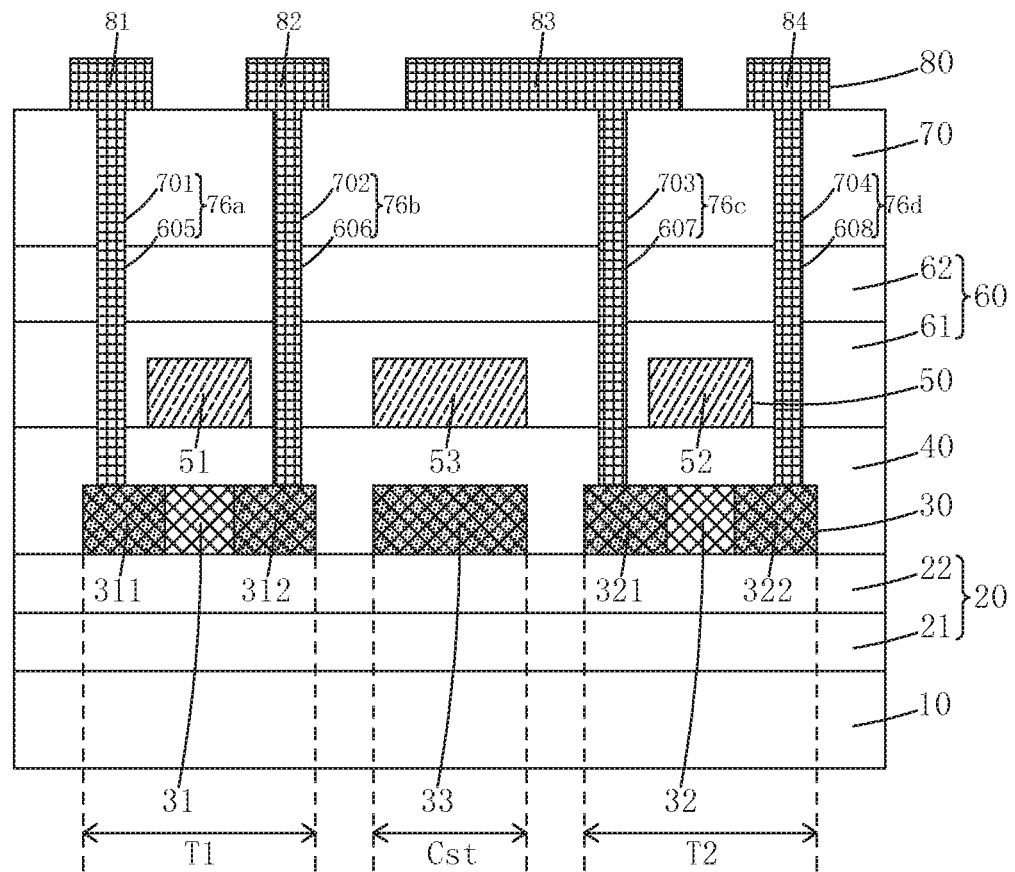
FIG. 13 is a diagram of step 3 of the manufacture method of the OLED back plate according to the present invention.

Specifically, step 2 comprises:

step 21, as shown in FIG. 11, coating an organic photoresist on the interlayer dielectric layer 60 to form the planarization layer 70, and patterning the planarization layer 70 to form a first through hole 701 and a second through hole 702 correspondingly above the first source contact area 311 and the first drain contact area 312, respectively, and a third through hole 703 and a fourth through hole 704 correspondingly above the second source contact area 321 and the second drain contact area 322, respectively on the planarization layer 70.

step 22, as shown in FIG. 12, employing the patterned planarization layer 70 as a mask to etch the interlayer dielectric layer 60 to form a fifth through hole 605, a sixth through hole 606, a seventh through hole 607 and an eighth through hole 608 correspondingly below the first through hole 701, the second through hole 702, the third through hole 703 and the fourth through hole 704 on the interlayer dielectric layer 60;

The first through hole 701 and the fifth through hole 605 constituting the first source contact hole 76a, and the second through hole 702 and the sixth through hole 606 constituting the first drain contact hole 76b, and the third through hole 703 and the seventh through hole 607 constituting the second source contact hole 76c, and the fourth through hole 704 and the eighth through hole 608 constituting the second drain contact hole 76d.

step 3, as shown in FIG. 13, forming a source-drain material layer 80 on the planarization layer 70, and patterning the source-drain material layer 80 to obtain a first source

81, a first drain 82, a second source 83 and a second drain 84, which are spaced, and the first source 81, the first drain 82, the second source 83 and the second drain 84 contacting with the first source contact area 311, the first drain contact area 312, the second source contact area 321 and the second drain contact area 322 respectively through the first contact hole 76a, the first drain contact hole 76b, the second contact hole 76c and the second drain contact hole 76d;

the first source 81, the first drain 82, the first semiconductor pattern 31 and the first gate 51 constituting a switch TFT T1; the second source 83, the second drain 84, the second semiconductor pattern 32 and the second gate 52 constituting a drive TFT T2.

Specifically, the storage capacitor Cst is located between the switch TFT T1 and the drive TFT T2.

Figure 14:
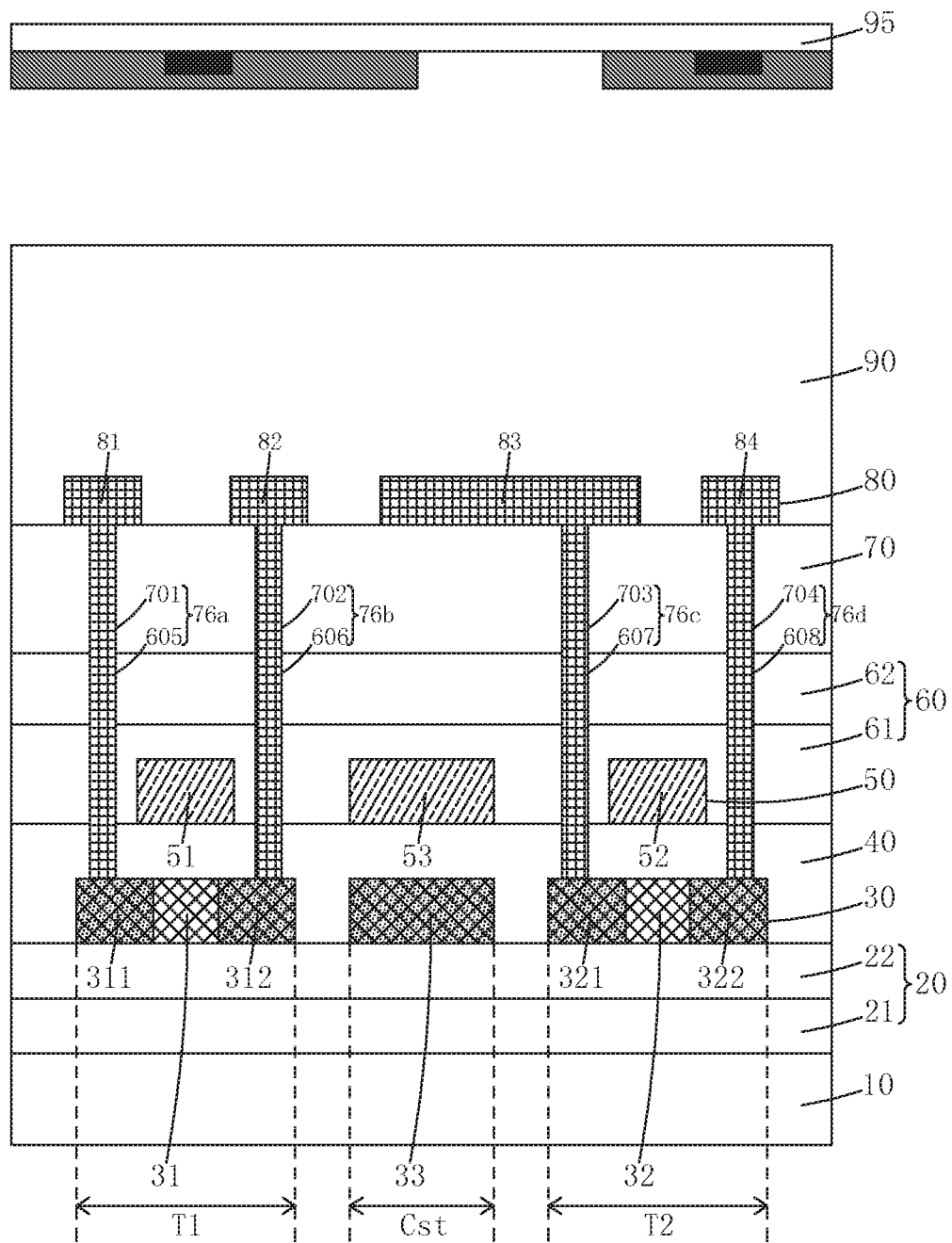
FIG. 14 and FIG. 15 are diagrams of step 4 of the manufacture method of the OLED back plate according to the present invention and FIG. 15 is also a structure diagram of the OLED back plate according to the present invention.
Figure 15:
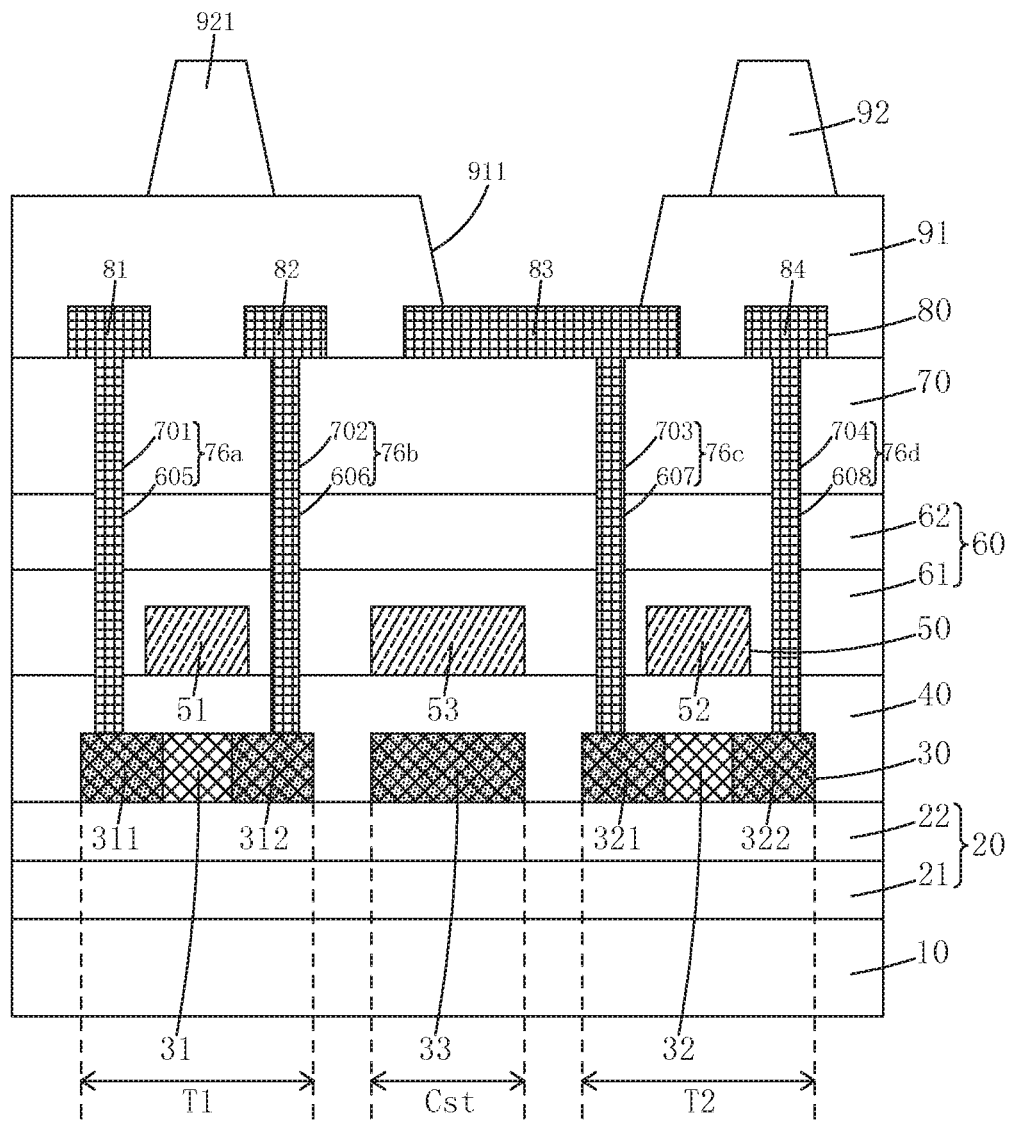

Specifically, the first source 81, the first drain 82, the second source 83 and the second drain 84 comprises two indium tin oxide layers and a silver layer sandwiched between the two indium tin oxide layers.

step 4, as shown in FIG. 14 and FIG. 15, forming a pixel definition layer 91 on the source-drain material layer 80 and the planarization layer 70, and forming a support layer 92 on the pixel definition layer 91;

the pixel definition layer 91 being arranged with an opening 911 correspondingly above the second source 83, and the opening 911 defining an OLED light emitting area on the second source 83; the second source 83 serving as an anode of the OLED at the same time.

Specifically, step 4 comprises:

step 41, as shown in FIG. 14, coating an organic photoresist on the source-drain material layer 80 and the planarization layer 70 to form an organic photoresist layer 90;

step 42, as shown in FIG. 15, employing a halftone mask 95 to implement exposure and development to the organic photoresist layer 90, and meanwhile obtaining the pixel definition layer 91 and the support layer 92.

Specifically, the support layer 92 comprises a plurality of supports 921 which are spaced, and shapes of the supports 921 are columns, and the supports 921 are employed to support the evaporation mask in the following evaporation process of the OLED light emitting material.

In the aforesaid manufacture method of the OLED back plate, by forming the planarization layer 70 on the interlayer dielectric layer 60, and the planarization layer 70 can serve as the mask of the etching process of the interlayer dielectric layer 60, and also can make the surface of the second source 83 made on the surface thereof be flattened, which is advantageous to increase the area of the OLED light emitting area and to increase the aperture ratio.

Please refer to FIG. 15. On the basis of the aforesaid manufacture method of the OLED back plate, the present invention further provides an OLED back plate, comprising: a substrate 10, a buffer layer 20, a semiconductor layer 30, a gate insulation layer 40, a gate material layer 50, an interlayer dielectric layer 60, a planarization layer 70, a source-drain material layer 80, a pixel definition layer 91 and a support layer 92 from bottom to top;

the semiconductor layer 30 comprising a first semiconductor pattern 31, a second semiconductor pattern 32 and a first storage electrode 33, which are spaced; the gate material layer 50 comprising a first gate 51, a second gate 52 and a second storage electrode 53, which are spaced, and the first gate 51, the second gate 52 and the second storage electrode 53 being correspondingly arranged above the first semiconductor pattern 31, the second semiconductor pattern 32 and the first storage electrode 33, respectively;

the source-drain material layer 80 comprises a first source 81, a first drain 82, a second source 83 and a second drain 84 which are spaced;

two ends of the first semiconductor pattern 31 being respectively arranged with a first source contact area 311 and a first drain contact area 312, and two ends of the second semiconductor pattern 32 being respectively arranged with a second source contact area 321 and a second drain contact area 322;

a first contact hole 76a and a first drain contact hole 76b correspondingly above the first source contact area 311 and the first drain contact area 312, respectively, and a second contact hole 76c and a second drain contact hole 76d correspondingly above the second source contact area 321 and the second drain contact area 322, respectively being arranged on the planarization layer 70 and the interlayer dielectric layer 60;

the first source 81, the first drain 82, the second source 83 and the second drain 84 contacting with the first source contact area 311, the first drain contact area 312, the second source contact area 321 and the second drain contact area 322 respectively through the first contact hole 76a, the first drain contact hole 76b, the second contact hole 76c and the second drain contact hole 76d;

the first source 81, the first drain 82, the first semiconductor pattern 31 and the first gate 51 constituting a switch TFT T1; the second source 83, the second drain 84, the second semiconductor pattern 32 and the second gate 52 constituting a drive TFT T2; the first storage electrode 33 and the second storage electrode 53 constituting a storage capacitor Cst;

the pixel definition layer 91 being arranged with an opening 911 correspondingly above the second source 83, and the opening 911 defining an OLED light emitting area on the second source 83; the second source 83 serving as an anode of the OLED at the same time.

Specifically, the substrate 10 is a glass substrate.

Specifically, the buffer layer 20 comprises a first silicon nitride layer 21 located on the substrate 10 and a second silicon oxide layer 22 located on the first silicon nitride layer 21.

Specifically, materials of the first semiconductor pattern 31, the second semiconductor pattern 32 and the first storage electrode 33 are polysilicon, and all of the first source contact area 311, the first drain contact area 312, the second source contact area 321, the second drain contact area 322 and the entire first storage electrode 33 are P type ion heavily doped areas, and the P type ion is boron ion.

Specifically, an ion concentration range in the ion heavily doped areas is $10^{19}$-$10^{21}$ ions/cm$^3$.

Preferably, all of the first source contact area 311, the first drain contact area 312, the second source contact area 321, the second drain contact area 322 and the entire first storage electrode 33 are P type ion heavily doped areas, and the P type ion is boron ion.

Specifically, a material of the gate insulation layer 40 comprises at least one of silicon oxide and silicon nitride.

Specifically, materials of the first gate 51, the second gate 52 and the second storage electrode 53 are molybdenum.

Specifically, the interlayer 60 comprises a second silicon oxide layer 61 on the gate material layer 50 and the gate insulation layer 40 and a second silicon nitride layer 62 on the second silicon oxide layer 61.

Specifically, the first source 81, the first drain 82, the second source 83 and the second drain 84 comprises two indium tin oxide layers and a silver layer sandwiched between the two indium tin oxide layers.

Specifically, both materials of the pixel definition layer 91 and the support layer 92 are organic photoresist, and the two have the same materials, and are structurally integrated.

Specifically, the support layer 92 comprises a plurality of supports 921 which are spaced, and shapes of the supports 921 are columns.

Specifically, a first through hole 701 and a second through hole 702 correspondingly above the first source contact area 311 and the first drain contact area 312, respectively, and a third through hole 703 and a fourth through hole 704 correspondingly above the second source contact area 321 and the second drain contact area 322, respectively are arranged on the planarization layer 70;

a fifth through hole 605, a sixth through hole 606, a seventh through hole 607 and an eighth through hole 608 correspondingly below the first through hole 701, the second through hole 702, the third through hole 703 and the fourth through hole 704 are arranged on the interlayer dielectric layer 60;

The first through hole 701 and the fifth through hole 605 constituting the first source contact hole 76a, and the second through hole 702 and the sixth through hole 606 constituting the first drain contact hole 76b, and the third through hole 703 and the seventh through hole 607 constituting the second source contact hole 76c, and the fourth through hole 704 and the eighth through hole 608 constituting the second drain contact hole 76d.

Specifically, the first storage electrode 33 is arranged between the first semiconductor pattern 31 and the second semiconductor pattern 32, and the second storage electrode 53 is arranged between the first gate 51 and the second gate 52, and thus the storage capacitor Cst is located between the switch TFT T1 and the drive TFT T2.

In the aforesaid OLED back plate, by forming the planarization layer 70 on the interlayer dielectric layer 60 to make the surface of the second source 83 made on the surface of the planarization layer 70 be flattened, of which the OLED light emitting area is larger and the aperture ratio is higher.

In conclusion, the present invention provides an OLED back plate and a manufacture method thereof. In the manufacture method of the OLED back plate of the present invention, by forming the planarization layer on the interlayer dielectric layer, and the planarization layer can serve as the mask of the etching process of the interlayer dielectric layer, and also can make the surface of the second source made on the surface thereof be flattened, which is advantageous to increase the area of the OLED light emitting area and to increase the aperture ratio. In the OLED back plate of the present invention, by forming the planarization layer on the interlayer dielectric layer, the surface of the second source made on the surface of the planarization layer is flattened, of which the OLED light emitting area is larger and the aperture ratio is higher.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED back plate, comprising: a substrate, a buffer layer, a semiconductor layer, a gate insulation layer, a gate material layer, an interlayer dielectric layer, a planarization layer formed on the interlayer dielectric layer to serve as a mask for etching the interlayer dielectric layer, a source-drain material layer, a pixel definition layer and a support layer from bottom to top;

the semiconductor layer comprising a first semiconductor pattern, a second semiconductor pattern and a first storage electrode, which are spaced; the gate material layer comprising a first gate, a second gate and a second storage electrode, which are spaced, and the first gate, the second gate and the second storage electrode being correspondingly arranged above the first semiconductor pattern, the second semiconductor pattern and the first storage electrode, respectively;

the source-drain material layer comprising a first source, a first drain, a second source and a second drain;

two ends of the first semiconductor pattern being respectively arranged with a first source contact area and a first drain contact area, and two ends of the second semiconductor pattern being respectively arranged with a second source contact area and a second drain contact area;

a first source contact hole and a first drain contact hole correspondingly above the first source contact area and the first drain contact area, respectively, and a second source contact hole and a second drain contact hole correspondingly above the second source contact area and the second drain contact area, respectively being arranged on the planarization layer and the interlayer dielectric layer;

the first source, the first drain, the second source and the second drain contacting with the first source contact area, the first drain contact area, the second source contact area and the second drain contact area respectively through the first source contact hole, the first drain contact hole, the second source contact hole and the second drain contact hole;

the first source, the first drain, the first semiconductor pattern and the first gate constituting a switch TFT; the second source, the second drain, the second semiconductor pattern and the second gate constituting a drive TFT; the first storage electrode and the second storage electrode constituting a storage capacitor;

the pixel definition layer being arranged with an opening correspondingly above the second source, and the opening defining an OLED light emitting area on the second source; the second source serving as an anode of the OLED at the same time, and a surface of the second source is flattened due to the planarization layer thereunder to increase an area of the OLED light emitting area and to increase an aperture ratio.

2. The OLED back plate according to claim 1, wherein both materials of the first semiconductor pattern, the second semiconductor pattern and the first storage electrode are polysilicon, and all of the first source contact area, the first drain contact area, the second source contact area, the second drain contact area and the entire first storage electrode are ion heavily doped areas.

3. The OLED back plate according to claim 2, wherein all of the first source contact area, the first drain contact area, the second source contact area, the second drain contact area and the entire first storage electrode are P type ion heavily doped areas, and the P type ion is boron ion.

4. The OLED back plate according to claim 1, wherein a first through hole and a second through hole correspondingly above the first source contact area and the first drain contact area, respectively, and a third through hole and a fourth through hole correspondingly above the second source contact area and the second drain contact area, respectively are arranged on the planarization layer;

a fifth through hole, a sixth through hole, a seventh through hole and an eighth through hole correspondingly below the first through hole, the second through hole, the third through hole and the fourth through hole are arranged on the interlayer dielectric layer;

the first through hole and the fifth through hole constituting the first source contact hole, and the second through hole and the sixth through hole constituting the first drain contact hole, and the third through hole and the seventh through hole constituting the second source contact hole, and the fourth through hole and the eighth through hole constituting the second drain contact hole.

5. The OLED back plate according to claim 1, wherein both materials of the pixel definition layer and the support layer are organic photoresist, and the two have the same materials, and are structurally integrated.

6. An OLED back plate, comprising: a substrate, a buffer layer, a semiconductor layer, a gate insulation layer, a gate material layer, an interlayer dielectric layer, a planarization layer formed on the interlayer dielectric layer to serve as a mask for etching the interlayer dielectric layer, a source-drain material layer, a pixel definition layer and a support layer from bottom to top;

the semiconductor layer comprising a first semiconductor pattern, a second semiconductor pattern and a first storage electrode, which are spaced; the gate material layer comprising a first gate, a second gate and a second storage electrode, which are spaced, and the first gate, the second gate and the second storage electrode being correspondingly arranged above the first semiconductor pattern, the second semiconductor pattern and the first storage electrode, respectively;

the source-drain material layer comprising a first source, a first drain, a second source and a second drain;

two ends of the first semiconductor pattern being respectively arranged with a first source contact area and a first drain contact area, and two ends of the second semiconductor pattern being respectively arranged with a second source contact area and a second drain contact area;

a first source contact hole and a first drain contact hole correspondingly above the first source contact area and the first drain contact area, respectively, and a second source contact hole and a second drain contact hole correspondingly above the second source contact area and the second drain contact area, respectively being arranged on the planarization layer and the interlayer dielectric layer;

the first source, the first drain, the second source and the second drain contacting with the first source contact area, the first drain contact area, the second source contact area and the second drain contact area respectively through the first source contact hole, the first drain contact hole, the second source contact hole and the second drain contact hole;

the first source, the first drain, the first semiconductor pattern and the first gate constituting a switch TFT; the second source, the second drain, the second semiconductor pattern and the second gate constituting a drive TFT; the first storage electrode and the second storage electrode constituting a storage capacitor;

the pixel definition layer being arranged with an opening correspondingly above the second source, and the opening defining an OLED light emitting area on the second source; the second source serving as an anode of the OLED at the same time, and a surface of the second source is flattened due to the planarization layer thereunder to increase an area of the OLED light emitting area and to increase an aperture ratio;

wherein both materials of the first semiconductor pattern, the second semiconductor pattern and the first storage electrode are polysilicon, and all of the first source contact area, the first drain contact area, the second source contact area, the second drain contact area and the entire first storage electrode are ion heavily doped areas;

wherein both materials of the pixel definition layer and the support layer are organic photoresist, and the two have the same materials, and are structurally integrated.

7. The OLED back plate according to claim 6, wherein all of the first source contact area, the first drain contact area, the second source contact area, the second drain contact area and the entire first storage electrode are P type ion heavily doped areas, and the P type ion is boron ion.

8. The OLED back plate according to claim 6, wherein a first through hole and a second through hole correspondingly above the first source contact area and the first drain contact area, respectively, and a third through hole and a fourth through hole correspondingly above the second source contact area and the second drain contact area, respectively are arranged on the planarization layer;

a fifth through hole, a sixth through hole, a seventh through hole and an eighth through hole correspondingly below the first through hole, the second through hole, the third through hole and the fourth through hole are arranged on the interlayer dielectric layer;

the first through hole and the fifth through hole constituting the first source contact hole, and the second through hole and the sixth through hole constituting the first drain contact hole, and the third through hole and the seventh through hole constituting the second source contact hole, and the fourth through hole and the eighth through hole constituting the second drain contact hole.

* * * * *